(12) United States Patent
Zhang (10) Patent No.: US 10,776,925 B2
(45) Date of Patent: Sep. 15, 2020

(54) SYSTEM AND METHOD FOR GENERATING A WATER-FAT SEPERATED IMAGE (71) Applicant: GENERAL ELECTRIC COMPANY, Schenectady, NY (US)

(72) Inventor: Tao Zhang, Fremont, CA (US)

(73) Assignee: GENERAL EELECTRIC COMPANY, Schenectady, NY (US)

( * ) Notice: Subject to any disclaimer, the term of this patent is extended or adjusted under 35 U.S.C. 154(b) by 239 days.

(21) Appl. No.: 15/964,298

(22) Filed: Apr. 27, 2018

(65) Prior Publication Data

US 2019/0333227 A1 Oct. 31, 2019

(51) Int. Cl.
*G06K 9/62* (2006.01)
*G06T 7/149* (2017.01)
*G01R 33/48* (2006.01)
*G06T 7/174* (2017.01)

(52) U.S. Cl.
CPC .......... *G06T 7/174* (2017.01); *G01R 33/4828* (2013.01); *G06K 9/6262* (2013.01); *G06T 7/149* (2017.01); *G06K 2209/05* (2013.01); *G06T 2207/10088* (2013.01); *G06T 2207/20081* (2013.01); *G06T 2207/20084* (2013.01); *G06T 2207/20224* (2013.01)

(58) Field of Classification Search
None
See application file for complete search history.

(56) References Cited

U.S. PATENT DOCUMENTS

| | | | |
|---|---|---|---|
| 5,627,469 A | 5/1997 | Hong et al. | |
| 6,483,308 B1 | 11/2002 | Ma et al. | |
| 7,176,683 B2 | 2/2007 | Reeder et al. | |
| 7,227,359 B2 | 6/2007 | Ma | |
| 8,030,923 B2 | 10/2011 | Yu et al. | |
| 8,774,475 B2 | 7/2014 | Bernhard et al. | |
| 2007/0098298 A1 | 5/2007 | Qing-San | |
| 2014/0303478 A1* | 10/2014 | Roche | G01R 33/5608 600/410 |
| 2017/0234952 A1 | 8/2017 | Tao et al. | |
| 2019/0336033 A1* | 11/2019 | Takeshima | A61B 6/5258 |

OTHER PUBLICATIONS

W. Thomas Dixon, Ph.D., Simple Proton Spectroscopic Imaging, Mallinckrodt Institute of Radiology, Washington University School of Medicine,1984, 189-194, St. Louis, MO US.

(Continued)

*Primary Examiner* — Idowu O Osifade
(74) *Attorney, Agent, or Firm* — Grogan, Tuccillo & Vanderleeden, LLP (57) ABSTRACT

A system for generating a water-fat separated image is provided. The system includes a memory device that stores training results of a neural network, and an MRI controller in electronic communication with the memory device and a magnet assembly. The controller is operative to: acquire MR data from an object via the magnet assembly; generate at least two magnitude images from the acquired MR data; and generate the water-fat separated image by applying the training results to the at least two magnitude images.

20 Claims, 10 Drawing Sheets

(56) References Cited

OTHER PUBLICATIONS

Jingfei Ma, Breathe-Hold Water and Fat Imaging Using a Dual-Echo Two-Point Dixon Technique With an Efficient and Robust Phase-Correction Algorithm, Magnetic Resonance in Medicine 52, 2004, 415-419, Wiley-Liss Inc., US.

Qing-San Xiang, Two-Point Water-Fat Imaging With Partially-Opposed-Phase (POP) Acquisition: An Asymmetric Dixon Method, Magnetic Resonance in Medicine 56, 2006, 572-584, Wiley-Liss Inc., US.

Holger Eggers, Bernhard Brenhard Brendel, Adri Duijndam, and Gwenael Herigault, Dual-Echo Dixon Imaging With Flexible Choice of Echo Times, Magnetic Resonance in Medicine 65, 2011, 96-107, Wiley-Liss, Inc., US.

Johan Berglund, Hakan Ahlstrom, Lars Johansson, and Joel Kullberg, Two-Point Dixon Method With Flexible Echo Times, Magnetic Resonance in Medicine 65, 2011, 994-1004, Wiley-Liss, Inc., US.

Tao Zhang, Yuxin Chen, Shanshan Bao, Marcus T. Alley, John M. Pauly, Brian A. Hargreaves, and Shreyas S. Vasanawala, Resolving Phase Ambiguity in Dual-Echo Dixon Imaging Using a Projected Power Method, Magnetic Resonance in Medicine 00, 2016, 1-11, Wiley Periodicals, Inc., US.

Olaf Ronneberger, Philipp Fischer, and Thomas Brox, U-Net: Convolutional Networks for Biomedical Image Segmentation, Computer Science Department and Bioss Centre for Biological Signalling Studies, University of Freiburg, May 18, 2015, Germany.

Zhou Wang, Alan C. Bovik, Hamid R. Sheikh, Eero P. Simoncelli, Image Quality Assesment: From Error Visibility to Structural Similarity, IEEE Transaction on Image Processing, vol. 13, No. 4, Apr. 2004.

Enhao Gong, Greg Zaharchuk, and John Pauly, Improved Multi-Echo Water-Fat Separation Using Deep Learning, Electrical Engineering, Stanford University, Radiology, Stanford University, Stanford, CA, US.

Keras, Github https://github.com/keras-team/keras, p. 1-5.

Tensorflow, https://www.tensorflow.org/, p. 1-5.

* cited by examiner

SYSTEM AND METHOD FOR GENERATING A WATER-FAT SEPERATED IMAGE

TECHNICAL FIELD

This disclosure relates to a system and method for generating a water-fat separated image.

DISCUSSION OF ART

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses, also referred to hereinafter as the "MR signal," from the nuclei as the excited protons relax back to their lower energy normal state, a map or image of these nuclei responses as a function of their spatial location is generated and displayed. An image of the nuclei responses, also referred to hereinafter as an "MRI image" and/or simply "image," provides a non-invasive view of a subject's internal structure.

Many MRI systems generate water-fat separated images, e.g., MRI images in which the contributions to the MR signal from fat tissues and water, commonly referred to as the "fat signal component" and the "water signal component" of the MR signal, have been partially and/or fully separated from each other. As will be appreciated, "water images", which, as used herein, refer to a type of water-fat separated image where the fat signal component has been partially and/or fully removed, often provide a better diagnostic depiction/view of an object than traditional MRI images, which typically depict contributions to the MR signal from both water and fat tissues. Conversely, "fat images", as used herein, refer to a type of water-fat separated image in which the water signal component has been partially and/or fully removed.

Present approaches of generating water-fat separated images often involve solving for the fat component and/or the water component via a system of equations that models the contributions of fat tissues and water to the MR signal based on one or more underlying field maps. It is often difficult, however, to resolve phase ambiguity in and/or to accurately estimate these underlying field maps. As used herein, the term "phase" refers to the sign of the water signal component and/or the fat signal component. For example, "in-phase" refers to a scenario where the sign of the water signal component and the sign of the fat signal component are the same, e.g., the fat signal component adds/increases to the water signal component. Conversely, the terms "out-of phase" and "opposed-phase" refer to a scenario where the sign of the water signal component and the sign of the fat signal component are different/opposed, e.g., the fat signal component subtracts from the water signal component. Thus, some present approaches assume the underlying field maps to be smooth in order to down-select the optimal solution to the employed systems of equations. Such assumptions, however, may produce global and/or local swaps, which in turn may result in a degraded water-fat separated image. As used herein, the term "global swap" refers to a situation where a water image depicts only fat tissues and/or a fat image depicts only water tissues. In other words, a situation in which the solutions for the water and fat components are completely flipped in the entire water-fat separated image. Similarly, the term "local swap", as used herein, refers to a situation where one or more regions of a water image depict only fat tissues and/or one or more regions of a fat image depict only water tissues. In other words, a situation where the solutions for water and fat components are flipped in one or more parts/regions of an entire water-fat separated image.

While some present approaches of generating water-fat separated images, such as global optimization, have demonstrated robustness, i.e., the ability to generate an accurate water-fat separated image under conditions traditionally difficult to do so, e.g., in the presence of areas having large field map inhomogeneities, such approaches often required significant computational time.

Thus, an improved system and method for generating a water-fat separated image is generally desired.

BRIEF DESCRIPTION

In an embodiment, the present disclosure provides a system for generating a water-fat separated image. The system includes a memory device that stores training results of a neural network, and an MRI controller in electronic communication with the memory device and a magnet assembly. The controller is operative to: acquire MR data from an object via the magnet assembly; generate at least two magnitude images from the acquired MR data; and generate the water-fat separated image by applying the training results to the at least two magnitude images.

In another embodiment, the present disclosure provides a method of training a neural network. The method includes feeding a plurality of magnitude images to the neural network, wherein each magnitude image is generated from a set of MR data. The method further includes training a water-fat separation model on the plurality of magnitude images, wherein a loss function based at least in part on a structural dissimilarity metric is used in the training. The method further includes outputting the water-fat separation model as training results.

In yet another embodiment, the present disclosure provides a system for generating a water-fat separated image. The system includes a memory device and an MRI controller. The memory device stores training results of a neural network. The MRI controller in electronic communication with the memory device and a magnet assembly. The MRI controller is operative to: acquire MR data from an object via the magnet assembly; generate a real part image and an imaginary part image from the acquired MR data; and generate the water-fat separated image by applying the training results to the real part image and the imaginary part image.

In another embodiment, the present disclosure provides another method of training a neural network. The method includes feeding a plurality pairs of real part images and imaginary part images to the neural network, wherein each pair of real part image and imaginary part image is generated from a set of MR data. The method further includes training a water-fat separation model on the plurality pairs of real part images and imaginary part images, wherein a loss function based at least in part on a structural dissimilarity metric is used in the training. The method further includes outputting the water-fat separation model as training results.

DRAWINGS

Various aspects of this disclosure may be better understood upon reading the following detailed description and upon reference to the drawings in which.

The drawings illustrate specific aspects of the described systems and methods for generating a water-fat separated image. Together with the following description, the drawings demonstrate and explain the principles of the structures, methods, and principles described herein. In the drawings, the size of the components may be exaggerated or otherwise modified for clarity. Well-known structures, materials, or operations may not be shown or described in detail to avoid obscuring aspects of the described components, systems, and methods.

DETAILED DESCRIPTION

One or more specific embodiments of the present disclosure are described below in order to provide a thorough understanding. These described embodiments are only examples of systems and methods for generating a water-fat separated image. Moreover, as will be understood, embodiments of the invention are not limited to neural networks and, accordingly, may include other forms of artificial intelligence. The skilled artisan will understand that specific details described in the embodiments can be modified when being placed into practice without deviating from the spirit of the present disclosure.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The term "MR data," as used herein, refers to data, e.g., raw K-Space and/or image space, derived from an MR signal.

In addition, it should be understood that references to "one embodiment" or "an embodiment" of the present disclosure are not intended to be interpreted as excluding the existence of additional embodiments that also incorporate the recited features. Further, the limitations of the following claims are not written in means-plus-function format are not intended to be interpreted as such, unless and until such claim limitations expressly use the phrase "means for" followed by a statement of function void of further structure.

Further, it is to be understood that embodiments of the present invention may be applicable to Positron Emission Tomography ("PET")/MRIs, and/or any other systems that generate water-fat separated images.

Referring to the figures generally, the present disclosure is to provide systems and methods for generating a water-fat separated image via a neural network. In some embodiments, the neural network may be a convolutional network having a U-net based architecture that has been trained to receive, as input, a plurality of images, one or more of which may be magnitude and/or complex-valued images, generated from MR data acquired at two or more echo times, e.g., magnitude images generated from MR data acquired via a two-point Dixon pulse sequence. As used herein, the term "magnitude image" refers to an image having pixels that correspond to a magnitude of a solved water signal component or a solved fat-component, e.g., the absolute value of a complex-valued image at each echo time in a two-point Dixon pulse sequence. The term "complex-valued image", as used herein, refers to an image in which each pixel is derived from a complex number, i.e., a number having both real and imaginary parts, for a solved water and/or fat signal component. In embodiments, the magnitude and/or complex-valued images may be propagated through the neural network so as to generate/output a water image. In other words, embodiments of the present invention generate water-fat separated images by applying training results, e.g., weights, of a neural network to acquired magnitude and/or complex-valued images.

As will be understood, a water-fat separated image acquired from a two-point Dixon pulse sequence may be modeled by the following systems of equations:

$$\begin{cases} S_1 = (W + c_1 F)e^{i\varnothing 1} \\ S_2 = (W + c_2 F)e^{i\varnothing 2} \end{cases}$$

where W and F are real-valued water and fat signal components in image space, $S_1$ and $S_2$ are complex-valued signals acquired at two echo times, $c_1$ and $c_2$ are the dephasing factors with respect to water corresponding to the two echo times using a single peak or multiple peak fat model, and $e^{i\varnothing 1}$ and $e^{i\varnothing 2}$ are additional phase attributed to field inhomogeneity. For two-point Dixon imaging with in-phase and opposed-phase acquisition using a single peak fat model, $c_1$ and $c_2$ may be simplified to one (1) and negative-one (−1), respectively. Since there may be more unknowns, e.g., W, F, and ∅1/∅2, than the number of linear equations, the above system of equations for $S_1$ and $S_2$ has multiple solutions.

As stated above, traditional approaches to generating water-fat separated images rely on the assumption that the underlying field map(s) are smooth to down-select the optimal solution for the $S_1$ and $S_2$ signals. As will be appreciated, however, the final solutions for water and fat can be written as:

$$\begin{cases} W = f_1(S_1, S_2) \\ F = f_2(S_1, S_2) \end{cases}$$

Thus, as will be explained in greater detail below, embodiments of the present disclosure utilize a neural network trained to estimate W and/or F by approximating a mapping on magnitude images, as opposed to complex-valued images. In other words, in embodiments, the neural network may approximate one or more of the continuous functions:

$$W = f_1(|S_1|, |S_2|)$$

$$F = f_2(|S_1|, |S_2|)$$

As will be understood, however, embodiments of the invention are also able to approximate W and F from complex-valued images, e.g., images having real and imaginary components, as inputs to the neural network. In other words, in embodiments, the plurality of images from which the water-fat separated image is generated may include one or more complex-valued images. In such embodiments, the magnitudes of the one or more complex-valued images are passed/fed to the input layers of the neural network. Use of the magnitudes of one or more complex images avoids the need to pass/feed any phase information to the neural network 88.

By generating a water-fat separated image via a neural network, as opposed to solving for fat tissue and water tissue components via a system of equations, some embodiments of the present invention provide for systems and methods of generating a water-fat separated image without using complex-valued image phase information, which in turn, provides for more robustness and/or shorter computational time as compared to traditional approaches.

Figure 1:
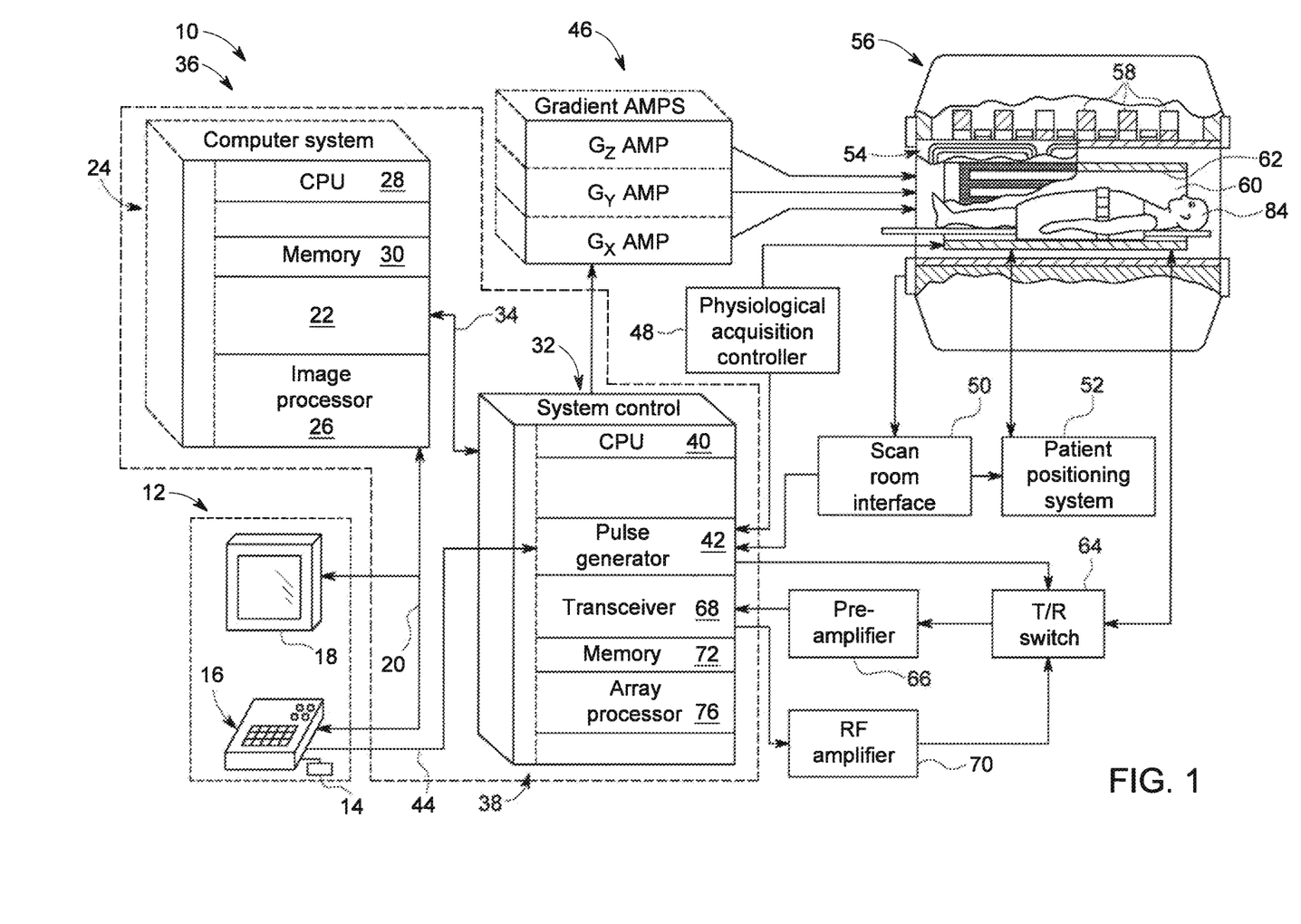
FIG. 1 is a block diagram of a system for generating a water-fat separated image, in accordance with an exemplary embodiment.

Accordingly, now referring to FIG. 1, the major components of an MRI system 10 incorporating an exemplary embodiment of the invention are shown. Accordingly, operation of the system 10 is controlled from the operator console 12, which includes a keyboard or other input device 14, a control panel 16, and a display screen 18. The console 12 may communicate through a link 20 with a separate computer system 22 that enables an operator to control the production and display of images on the display screen 18. The computer system 22 may include a number of modules, which communicate with each other through a backplane 24. In embodiments, these include an image processor module 26, a CPU module 28, and a memory module 30, which may include a frame buffer for storing image data arrays. The computer system 22 may communicate with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

In embodiments, the MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

Figure 3:
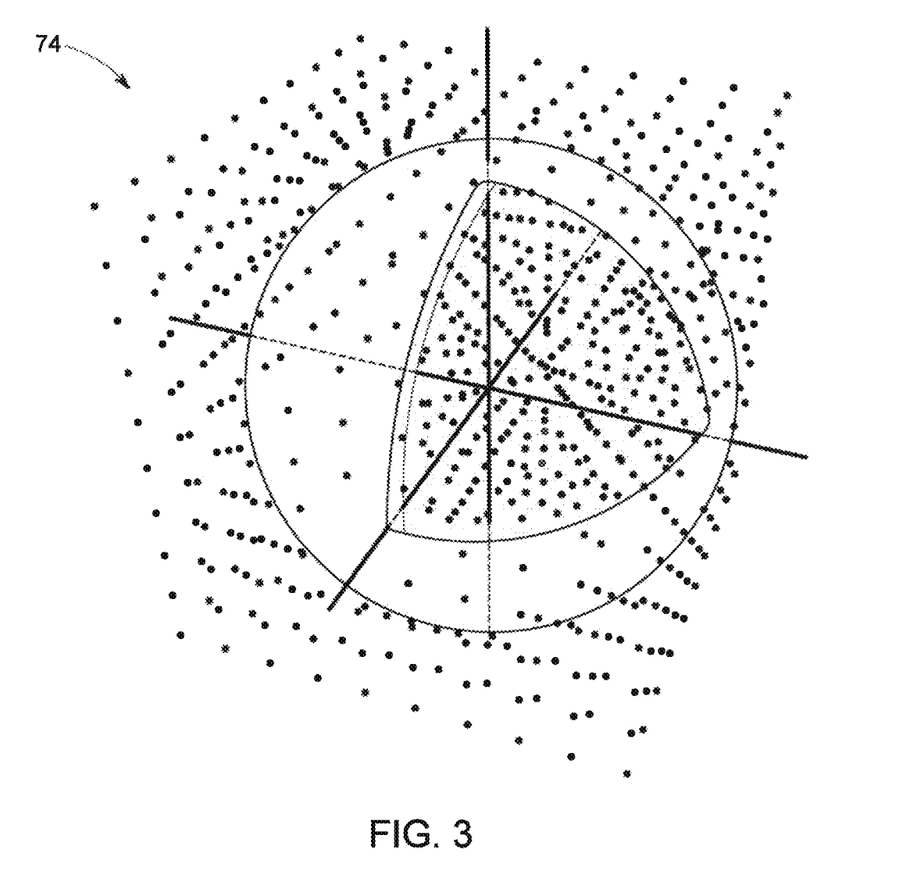
FIG. 3 is a diagram of a k-space acquired via the magnet assembly of FIG. 2, in accordance with an exemplary embodiment.

The MR signals picked up by the RF coil 62 are digitized by the transceiver module 68 and transferred to a memory module 72 in the system control 32. A scan is complete when an array of raw K-Space 74 (FIG. 3) data has been acquired in the memory module 72. This raw K-Space data/datum is rearranged into separate K-Space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26, conveyed to the operator console 12, and presented on the display 18.

Figure 2:
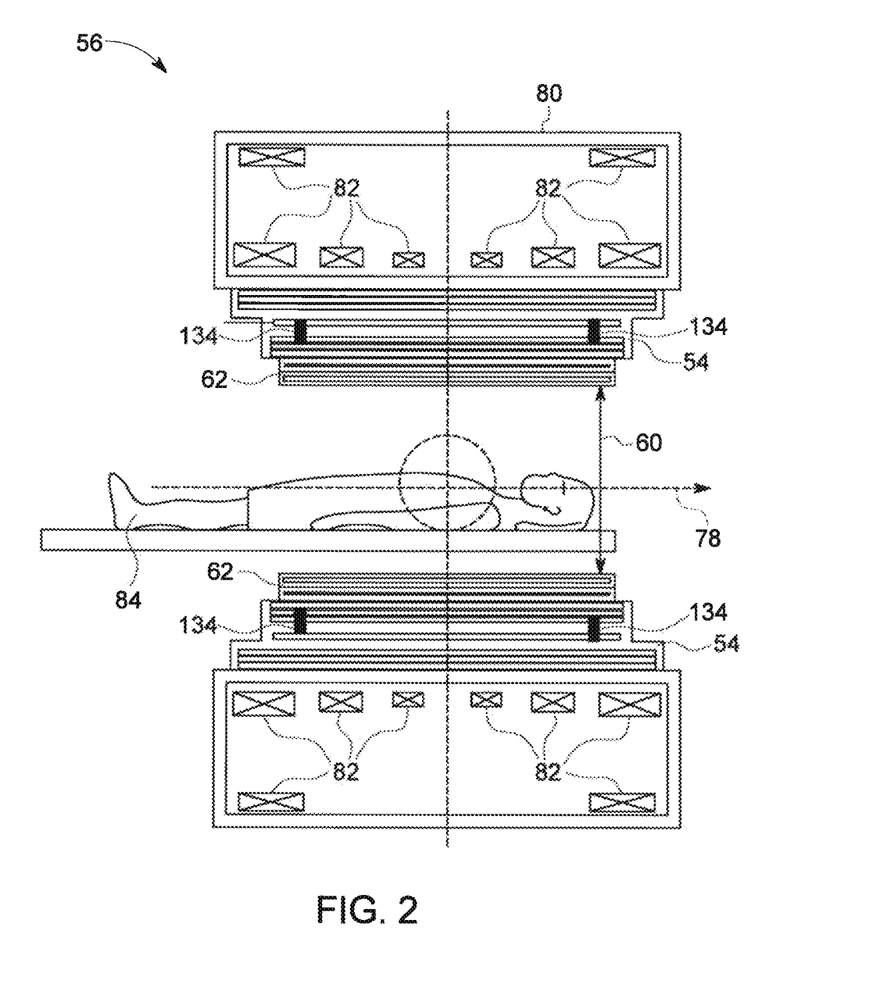
FIG. 2 is a schematic cross-sectional diagram of a magnet assembly of the system of FIG. 1, in accordance with an exemplary embodiment.

As illustrated in FIG. 2, a schematic side elevation view of the magnet assembly 56 is shown in accordance with an embodiment of the invention. The magnet assembly 56 is cylindrical in shape having a center/central axis 78. The magnet assembly 56 includes a cryostat 80 and one or more radially aligned longitudinally spaced apart superconductive coils 82 that form the polarizing magnet 58 (FIG. 1). The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Figure 4:
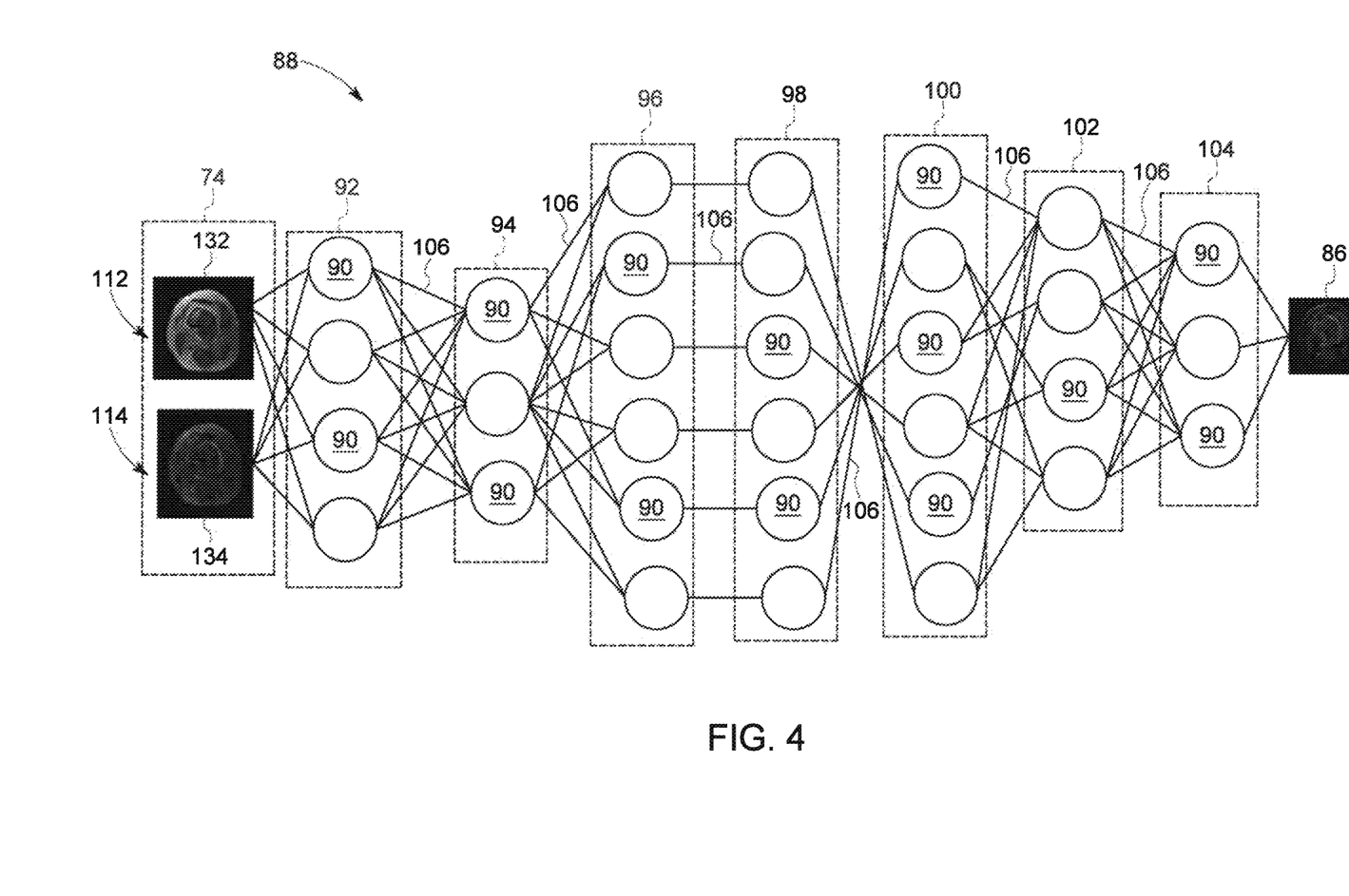
FIG. 4 is a diagram of a neural network of the system of FIG. 1, in accordance with an exemplary embodiment.

Moving now to FIG. 4, as stated above, embodiments of the system 10 may generate a water-fat separated image 86 via a neural network 88 having one or more nodes/neurons 90 which, in embodiments, may be disposed into one or more layers 92, 94, 96, 98, 100, 102, 104. As used herein with respect to neurons, the term "layer" refers to a collection of simulated neurons that have inputs and/or outputs connected in similar fashion to other collections of simulated neurons. Accordingly, as shown in FIG. 4, the neurons 90 may be connected to each other via one or more connections 106 such that data may propagate from an input layer 92, through one or more intermediate layers 94, 96, 98, 100, 102 to an output layer 104.

Figure 5:
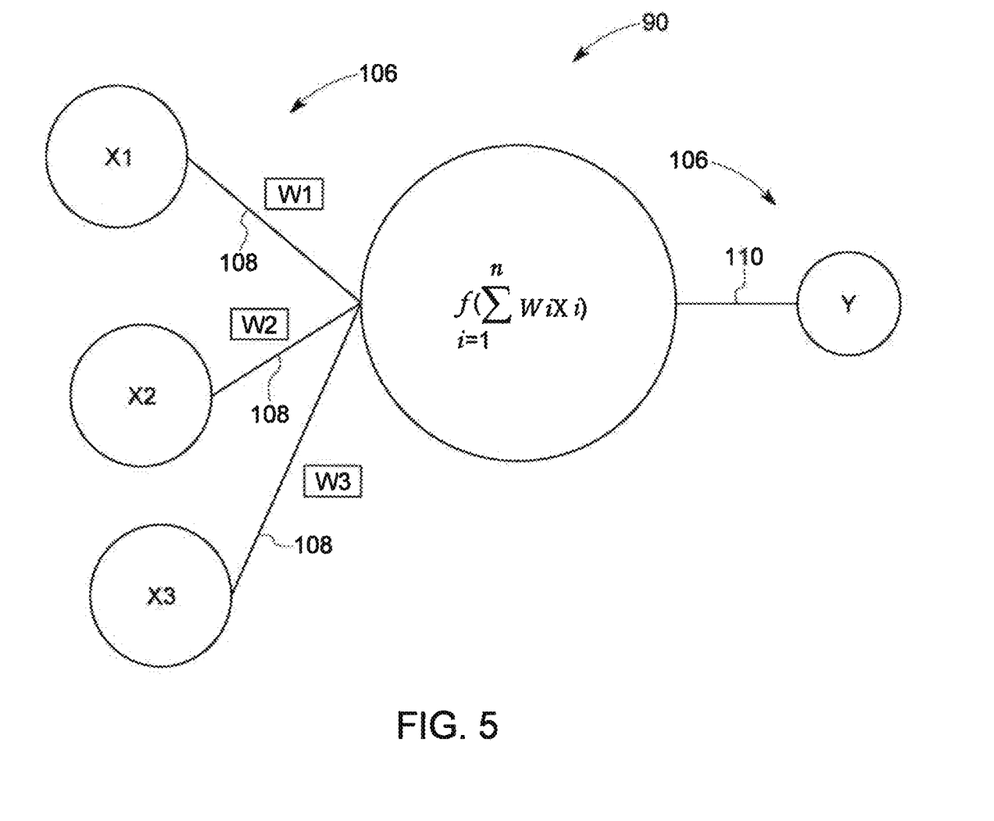
FIG. 5 is a diagram of a neuron of the neural network of FIG. 4, in accordance with an exemplary embodiment.

As shown in FIG. 5, the connections 106 of an individual neuron 90 may include one or more input connections 108 and one or more output connections 110. Each input connection 108 of a neuron 90 may be an output connection of a preceding neuron, and the output connections 110 of the neuron 90 may be an input connection of one or more subsequent neurons. While FIG. 5 depicts a neuron 90 as having a single output connection 110 it will be understood that neurons may have multiple output connections that transmit/pass the same value. In embodiments, the neurons 90 may be data constructs, e.g., structures, instantiated class objects, matrices, etc., and the input connections 108 may be received by a neuron 90 as weighted numerical values, e.g., floating point or integer values. For example, as further shown in FIG. 5, input connections X1, X2, and X3 may be weighted via weights W1, W2, and W3, respectively, summed, and sent/transmitted/passed as output connection Y. As will be appreciated, the processing of an individual neuron 90 may be represented, generally, by the equation:

$$Y = f\left(\sum_{i=1}^{n} WiXi\right)$$

where n is the total number of input connections 108 to the neuron 90. In embodiments, the value of Y may be based at least in part on whether the summation of WiXi exceeds a threshold. For example, Y may have a value of zero (0) if the summation of the weighted inputs fails to exceed a desired threshold.

As will be further understood, the input connections 108 of neurons 90 in the input layer 92 (FIG. 4) may be mapped to the MR data 74, while the output connections 110 of the neurons 90 in the output layer 104 (FIG. 4) may be mapped to the generated water-fat separated image 86. As used herein, "mapping" an input connection 108 to the MR data 74 refers to the manner by which the MR data 74 affects/dictates the value of the input connections 108. Similarly, as also used herein, "mapping" an output connection 110 to the generated water-fat separated image 86 refers to the manner by which the value of the output connection 110 affects the water-fat separated image 86.

Accordingly, in embodiments, the acquired/obtained MR data 74, or values derived therefrom, is passed/fed to the input layer 92 of the neutral network 88 and propagated through the layers 92, 94, 96, 98, 100, 102, 104 such that mapped output connections 110 of the output layer 104 generates/corresponds to the water-fat separated image 86. In embodiments, the water-fat separated image 86 may be a water image, a fat image, and/or a combination thereof. In embodiments, the MR data 74 may be fed/passed to the input layer 92 of the neural network 88 as at least two magnitude and/or complex-valued images generated from the MR data 74 by the MRI controller 36.

Figure 6:
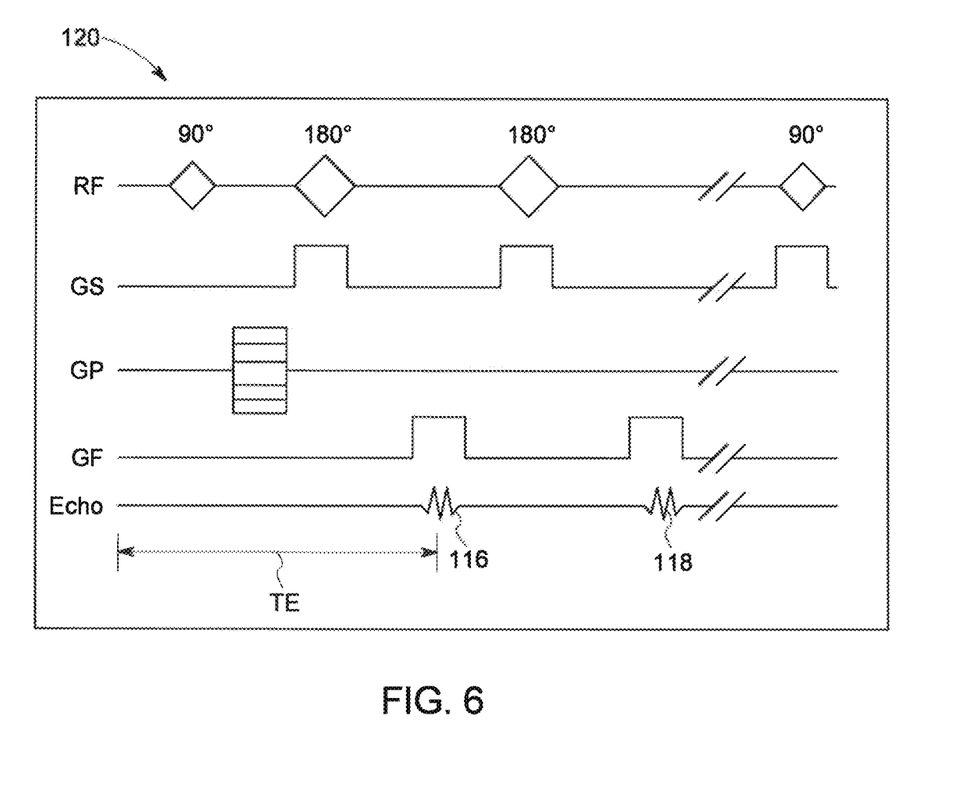
FIG. 6 is a diagram of a pulse sequence for acquiring the k-space of FIG. 3 via the magnet assembly of FIG. 2, in accordance with an exemplary embodiment.

For example, as further shown in FIG. 4, the MR data 74 may include two or more datasets 112 and 114 respectively acquired/obtained from the object 84 at two different echo times 116 (FIG. 6) and 118 (FIG. 6), which, in embodiments, may be acquired as part of a two-point Dixon pulse sequence 120 (FIG. 6). Thus, the water signal component and the fat signal component may be in-phase at the first echo time 116 and out-of-phase (opposed-phase) at the second echo time 118. In embodiments, the echo times 116 and 118 may be flexible echo times, i.e., the echo times at which the water signal component and/or the fat signal component are neither in-phase or completely out-of-phase (opposed-phase).

Figure 7:
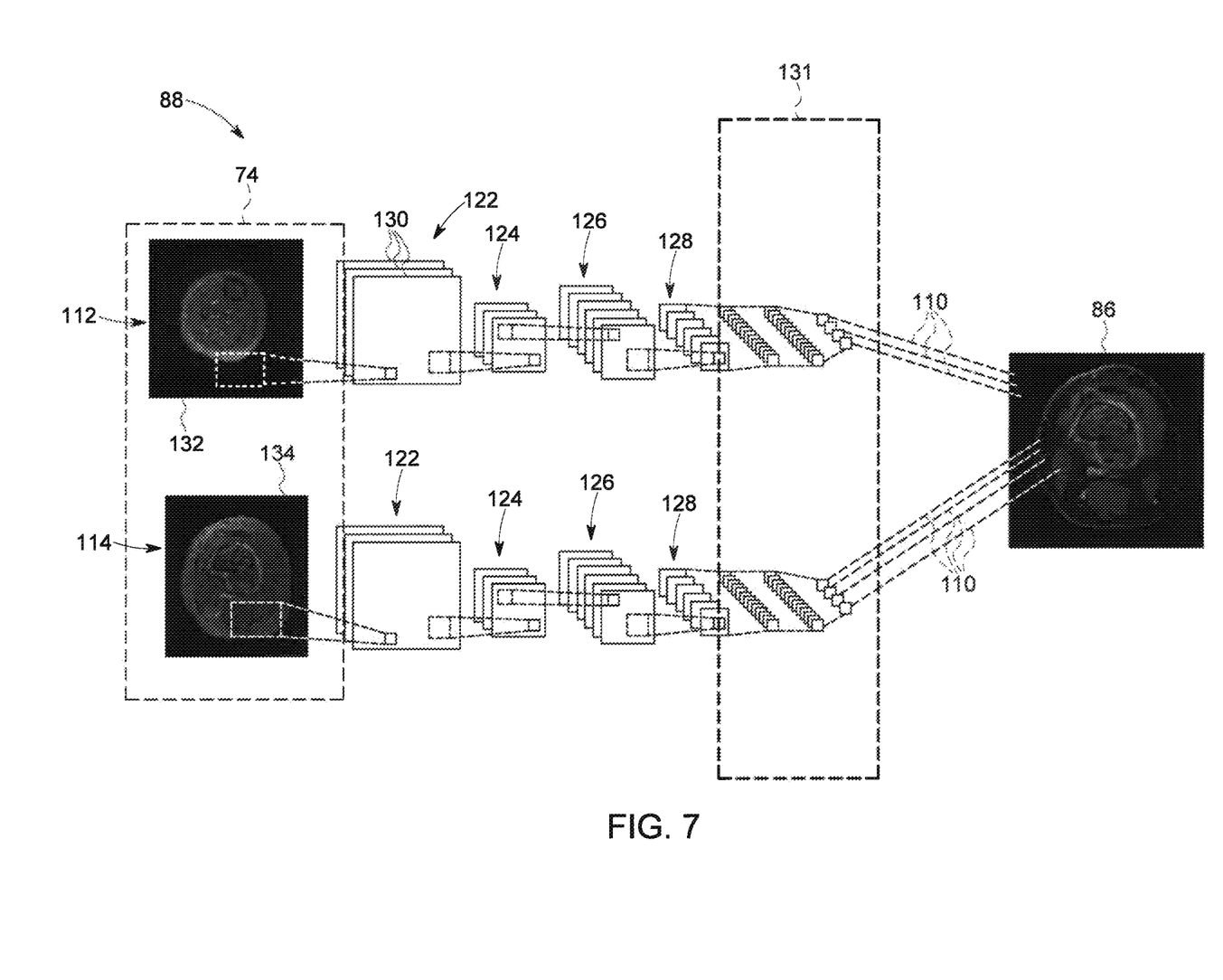
FIG. 7 is another diagram of the neural network of FIG. 4, in accordance with an exemplary embodiment.

Moving to FIG. 7, in embodiments, the neural network 88 may be a convolutional neural network having one or more convolution layers 122, 124, 126, 128 each having one or more filters 130. The convolution layers 122, 124, 126, 128 may feed into one or more connected layers (generally represented by dash box 131) with the output connections 110 of at least one of the connected layers 131 mapped to the water-fat separated image 86. As will be appreciated, the connected layers 131 may be neural layers similar to the layers 92, 94, 96, 98, 100, 102, 104 shown in FIG. 4. In embodiments, the convolutional layers may be pooled, e.g., layer 122 may be down-sampled to layer 124, layer 124 may be down-sampled to layer 126, layer 126 may be down-sampled to layer 128, etc. In such embodiments, the MR data 74 may be one or more images 132 and 134 respectively generated from the two or more datasets 112 and 114, which may be mapped to an input convolutional layer, e.g., layer 122. In other words, in embodiments, the neural network 88 may be a convolutional neural network that generates a water-fat separated image 86, e.g., a water image, from an in-phase image 132 and an out-of-phase image 134. In embodiments, at least one of the images 132 and 134 may be a magnitude image and/or a complex-valued image.

Figure 8:
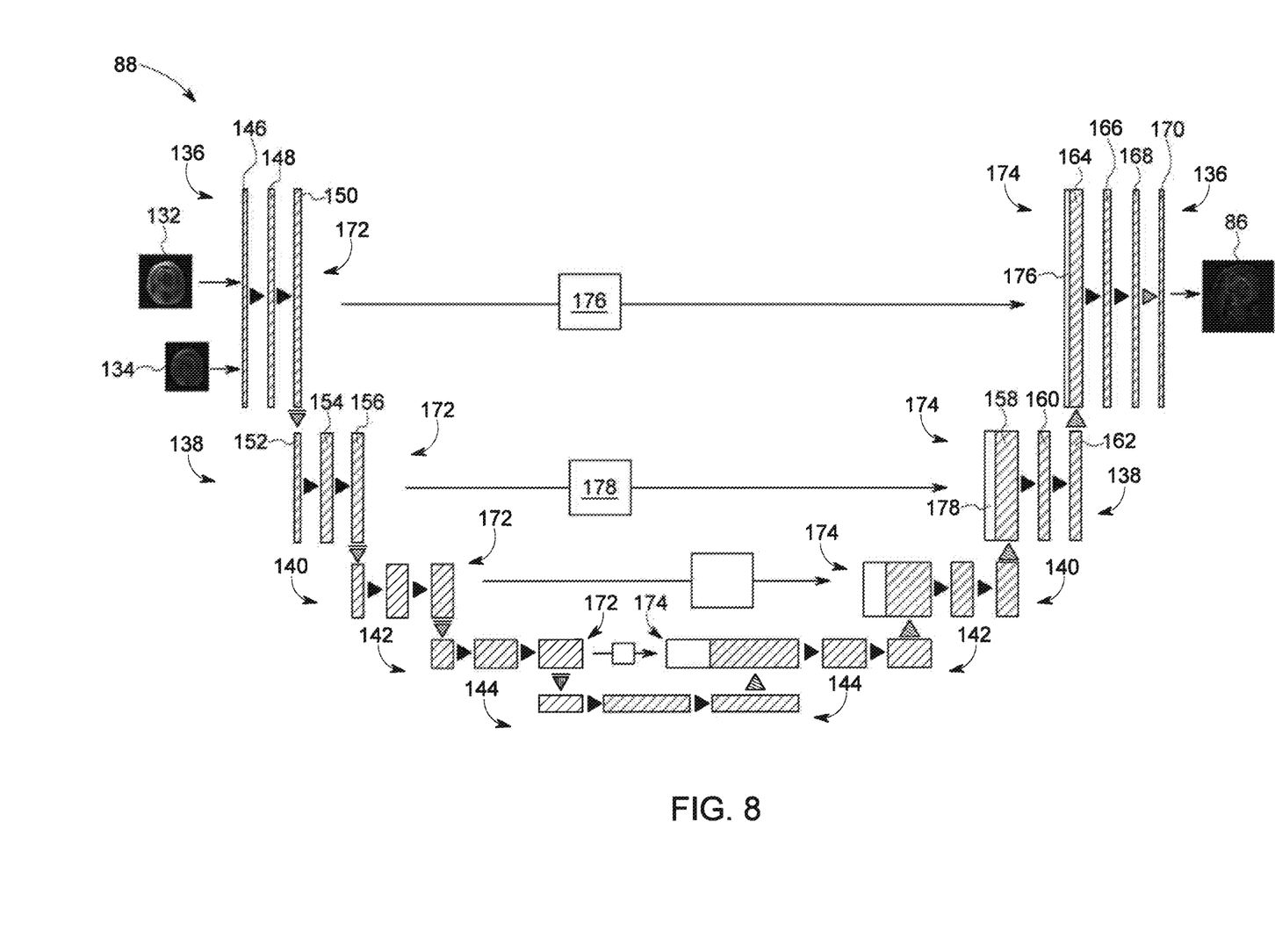
FIG. 8 is yet another diagram of the neural network of FIG. 4, in accordance with an exemplary embodiment.

Turning to FIG. 8, in embodiments, the neural network 88 may be a convolutional neural network based at least in part on a U-net architecture. For example, in certain embodiments, the neural network 88 may include one or more layers 136, 138, 140, 142, 144 of feature maps 146, 148, 150, 152, 154, 156, 158, 160, 162, 164, 166, 168, 170. As will be appreciated, in embodiments, the layers 136, 138, 140, 142, 144 may have respective resolutions of 256×256, 128×128, 64×64, 32×32, and 16×16. As will be understood, the resolution of the layers 136, 138, 140, 142, 144 may be varied across embodiments. The feature maps 146, 148, 150, 154, 156, 158, 160, 164, 166, 168, 170 may respectively have two (2), sixty-four (64), sixty-four (64), one-hundred and twenty-eight (128), one-hundred and twenty-eight (128), three-hundred and twenty (320), one-hundred and twenty-eight (128), one-hundred and ninety-two (192), sixty-four (64), sixty-four (64), and one (1) filters/kernels. As will be further understood, the number of filters/kernels for each feature map may be varied across embodiments.

The feature maps of each layer may be divided into front-end groupings 172 and back-end groupings 174. In such embodiments, the MR data 74, e.g., the in-phase 132 and the out-of-phase 134 images, may be mapped/fed to an input feature map 146 in the front-end grouping 172 of a top layer 136. The input feature map 146 is then convoluted through one or more intermediate feature maps 148 and an end feature map 150 within the same grouping 172 and layer 136. A portion 176 of the end feature map 150 is then copied to an input feature map 164 of the back-end grouping 174 of the same layer 136, while the back-end feature map 150 is also pooled into the input feature map 152 of the front-end grouping 172 of a subordinate layer 138.

Similar to layer 136, the input feature map 152 of the subordinate layer 138 is then convoluted through one or more intermediate layers 154 and an end future map 156 within the same front-end grouping 172 and layer 138, with a portion 178 of the back-end feature map 156 being copied to an input feature map 158 of the back-end grouping 174 of the same layer 138, and with the back-end feature map 156 being pooled into the input feature map of the next subordinate layer 140.

The input layer 158 of the back-end grouping 174 of layer 138 convolutes through one or more intermediate feature maps 160 and an end feature map 162 of the same back-end grouping 174 and layer 138. The end feature map 162 is then un-pooled/up-scaled into input layer 164 and combined with the portion 176 copied from the end feature map 150 so as to fill/complete feature map 164. Feature map 164 is then convoluted through one or more intermediate feature maps 166, 168 and an end feature map 170, with end feature map 170 mapped to the water-fat separated image 86 and/or one or more connected layers 131 (FIG. 7), which in turn may be mapped to the water-fat separated image 86.

As will be further understood, the layers 140, 142, and 144 convolute, copy, pool, and un-pool/upscale in a manner similar to layers 136 and 138, with the exception of layer 144 foregoing pooling as it is the bottom layer. Further, while FIG. 8 depicts the neural network 88 as having five (5) feature map layers, e.g., 136, 138, 140, 142, and 144, it will be understood that the number of feature map layers may be varied across embodiments.

Figure 9:
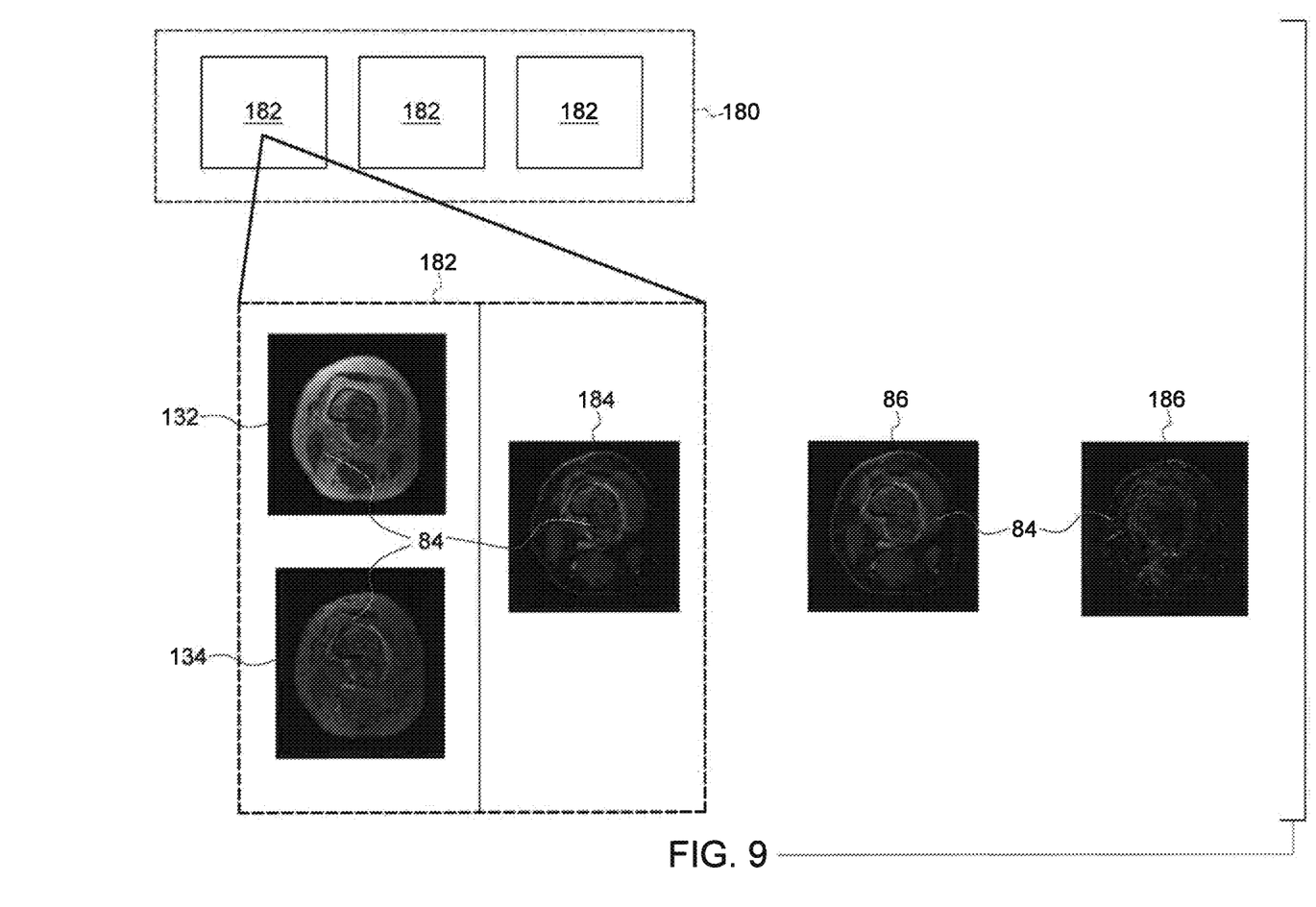
FIG. 9 is diagram of a dataset for training the neural network of FIG. 4, in accordance with an exemplary embodiment.

Moving to FIG. 9, in embodiments, the neural network 88 may be trained via "supervised learning", which, as used herein, refers to a process of training the weights of the neural network 88 with a dataset 180, e.g., a labeled dataset. For example, in embodiments, the dataset 180 may include one or more training elements/groupings 182 each including an in-phase image 132 of an object 84, an out-of-phase image 134 of the object 84, and a known water-fat separated image 184 of the object 84. The neural network 88 may, for each training element 182, generate a water-fat separated image 86 from the in-phase 132 and out-of-phase 134 image, with the generated water-fat separated image 86 being compared to the known water-fat separated image 184 so as to generate an error-mapping/differential image 186. The weights of the neural network 88 may then be adjusted via back-propagation, or other suitable methods, based at least in part on the error-mapping/differential image 186. As will be understood, the weights of the neural network 88 may be continuously adjusted/trained until the neural network 88 generates a water-fat separated image 86 that sufficiently and/or exactly matches the known water-fat separated image 184 for one or more training elements 182. In other words, the neural network 88 may be a water-fat separation model trained on a plurality of magnitude and/or complex-valued images and outputted as a training results, e.g., a collection of weights.

As will be further understood, in embodiments, the weights of the neural network 88 may be adjusted/trained based at least in part on a loss function, which as used herein, refers to a function that measures the degree that the generated water-fat separated image 86 fits/matches the known water-fat separated image 184. In embodiments, the loss function may be based at least in part on a structural dissimilarity ("DISSM") metric, e.g., the dissimilarity between two images x and y defined as $$DSSIM(x, y) = \frac{1 - SSIM(x, y)}{2},$$

$$\text{where } SSIM(x, y) = \frac{(2\mu_x\mu_y + c_1)(2\sigma_{xy} + c_2)}{(\mu_x^2 + \mu_y^2 + c_1)(\sigma_x^2 + \sigma_y^2 + c_2)},$$

with $\mu_x$ and $\sigma_x^2$ being the average and variance of x, $\mu_y$ and $\sigma_y^2$ being the average and variance of y, a being the covariance of x and y, and $c_1$ and $c_2$ being empirically determined constants. As will be appreciated, by basing the loss function at least in part on a DISSM metric, as opposed to least absolute deviation (L1) or least square errors (L2), certain embodiments of the present invention better simulate/represent human perception of images.

Accordingly, in embodiments, the neural network 88 may be trained with a stochastic gradient decent having the following parameters: a learning rate of about 0.1, a decaying factor of about 5e-5, a batch size of about 6, and a Nesterov momentum of about 0.9.

Figure 10:
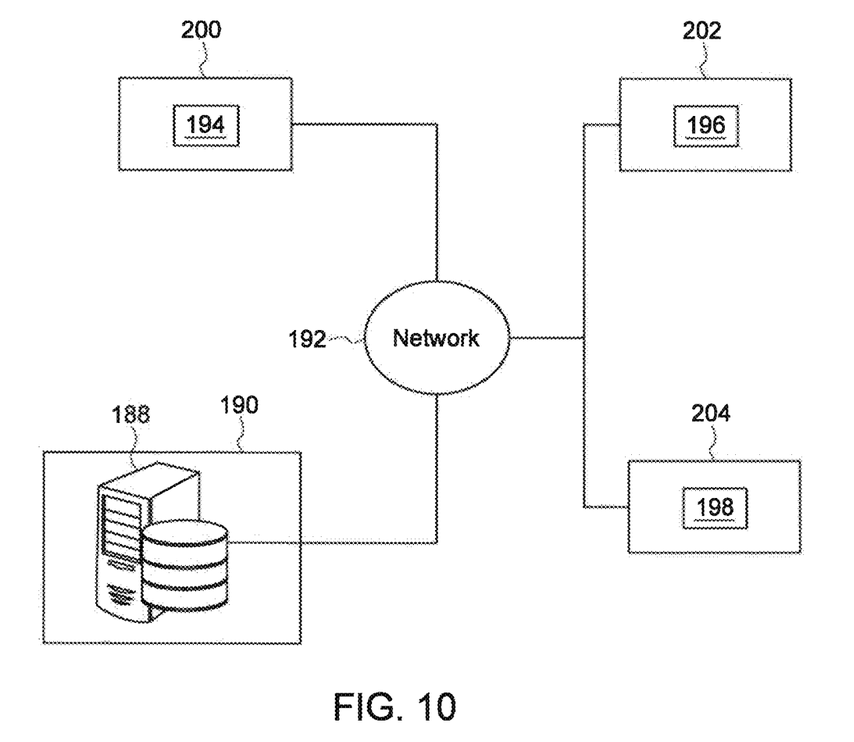
FIG. 10 is a block diagram of a server for training the neural network of FIG. 4, in accordance with an exemplary embodiment.

As illustrated in FIG. 10, an instantiation of the neural network 88 may be trained on a server 188, disposed at a first location 190, e.g., a research center and/or imaging system manufacturing site. Upon being trained to the point where the neural network 88 generates water-fat separated images 86 that are within acceptable error limits, e.g., water-fat separated images that are suitable for medical diagnostic purposes, the weights may be sent over a network 192, e.g., the Internet, to one or more imaging systems 194, 196, 198, which may be similar to imaging system 10 (FIGS. 1 and 2), disposed across one or more sites 200, 202, 204, e.g., medical facilities such as hospitals. Once received, the weights may be applied by instances/instantiations of the neural network 88 within the systems 194, 196, 198. In other words, in embodiments, the neural network 88 may be trained at a research facility 190 with the weights being pushed over a network 192 to various imaging systems 194, 196, 198 each running/executing an instance of the neural network 192. As will be appreciated, the neural network 88 may be continuously trained at the first site 190 with the weights being sent to the systems 194, 196, 198 at various intervals.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer readable medium, e.g., a medium that provides or participates in providing instructions to the at least one processor of the system 10 (or any other processor of a device described herein) for execution. Such a medium may take many forms, including but not limited to, non-volatile media and volatile media.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

Accordingly, by generating water-fat separated images via a neural network, some embodiments of the present invention provide for systems and methods that generate water-fat separated images that are of a diagnostic quality comparable to, and/or improved over, traditional approaches, e.g., global optimization, while having a reduced computational time. For example, some embodiments of the present invention may be able to generate a water-fat separated image in about ten (10) ms or less.

Further, by generating water-fat separated images from magnitude images, as opposed to complex-valued images, some embodiments of the present invention may provide for systems and methods of generating water-fat separated images that may be insensitive to potential phase errors incurred during acquisition of the MR data, e.g., during patient scanning. In other words, certain embodiments of the present invention may provide for systems and methods of generating water-fat separated images that are more robust in ability to handle field inhomogenities, and/or less likely to suffer from global and/or local water/fat swaps, than traditional approaches.

In addition to any previously indicated modification, numerous other variations and alternative arrangements may be devised by those skilled in the art without departing from the spirit and scope of this invention, and the appended claims are intended to cover such modifications and arrangements. Thus, while the invention has been described above with particularity and detail in connection with what is presently deemed to be the most practical and preferred aspects, it will be apparent to those of ordinary skill in the art that numerous modifications, including, but not limited to, form, function, manner of operations, and/or use may be made without departing from the principles and concepts set forth herein.

Finally, the examples and embodiments used herein are meant to be illustrative only and should not be construed to be limiting in any manner.

What is claimed is:

1. A system for generating a water-fat separated image, the system comprising:
   a memory device that stores training results of a neural network;
   the training results generated by supervised learning wherein the output of the neural network is optimized to a water-fat image dataset;
   an MRI controller in electronic communication with the memory device and a magnet assembly and operative to:
   acquire MR data from an object via the magnet assembly;
   generate at least two magnitude images from the acquired MR data; and
   generate the water-fat separated image by applying the training results to the at least two magnitude images.

2. The system of claim 1, wherein the water-fat separated image is a water image.

3. The system of claim 1, wherein the MR data is acquired from a pulse sequence having two or more echo times.

4. The system of claim 3, wherein
   a first magnitude image of the at least two magnitude images is generated from MR data acquired at a first echo time of the two or more echo times; and
   a second magnitude image of the at least two magnitude images is generated from MR data acquired at a second echo time of the two or more echo times.

5. The system of claim 3, wherein the pulse sequence is a two-point Dixon pulse sequence and the two or more echo times are flexible echo times.

6. The system of claim 1, wherein the MRI controller applies the training results to the at least two magnitude images via the neural network.

7. The system of claim 6, wherein the neural network is a convolutional neural network.

8. The system of claim 7, wherein the neural network is based at least in part on a U-net architecture.

9. A method of training a neural network, the method comprising:
   feeding a plurality of magnitude images to the neural network, wherein each magnitude image is generated from a set of MR data;

training a water-fat separation model on the plurality of magnitude images, wherein a loss function based at least in part on a structural dissimilarity metric is used in the training; and outputting the water-fat separation model as training results.

10. The method of claim 9, wherein the neural network is a convolutional neural network.

11. The method of claim 10, wherein the neural network is based at least in part on a U-net architecture.

12. The method of claim 9 further comprising:

transmitting the training results over a network to one or more instantiations of the neural network.

13. A system for generating a water-fat separated image, the system comprising:

a memory device that stores training results of a neural network;

the training results generated by supervised learning wherein the output of the neural network is optimized to a water-fat image dataset;

an MRI controller in electronic communication with the memory device and a magnet assembly and operative to:

acquire MR data from an object via the magnet assembly;

generate a real part image and an imaginary part image from the acquired MR data; and generate the water-fat separated image by applying the training results to the real part image and the imaginary part image.

14. The system of claim 13, wherein the MRI controller applies the training results to the real part image and the imaginary part image via the neural network.

15. The system of claim 14, wherein the neural network is a convolutional neural network.

16. The system of claim 15, wherein the neural network is based at least in part on a U-net architecture.

17. A method of training a neural network, the method comprising:

feeding a plurality pairs of real part images and imaginary part images to the neural network, wherein each pair of real part image and imaginary part image is generated from a set of MR data;

training a water-fat separation model on the plurality pairs of real part images and imaginary part images, wherein a loss function based at least in part on a structural dissimilarity metric is used in the training; and outputting the water-fat separation model as training results.

18. The method of claim 17, wherein the neural network is a convolutional neural network.

19. The method of claim 18, wherein the neural network is based at least in part on a U-net architecture.

20. The method of claim 17 further comprising:

transmitting the training results over a network to one or more instantiations of the neural network.

* * * * *